(12) United States Patent
Yamamoto et al.

(10) Patent No.: US 7,271,636 B2
(45) Date of Patent: Sep. 18, 2007

(54) HYSTERESIS COMPARATOR AND RESET SIGNAL GENERATOR

(75) Inventors: Hiroya Yamamoto, Ora-Gun (JP); Masahiro Umewaka, Ota (JP); Shinji Osugi, Ora-Gun (JP)

(73) Assignee: Sanyo Electric Co., Ltd., Osaka (JP)

( * ) Notice: Subject to any disclaimer, the term of this patent is extended or adjusted under 35 U.S.C. 154(b) by 19 days.

(21) Appl. No.: 11/163,757

(22) Filed: Oct. 28, 2005

(65) Prior Publication Data

US 2006/0091924 A1    May 4, 2006

(30) Foreign Application Priority Data

Oct. 28, 2004   (JP)   ............... P2004-314627

(51) Int. Cl.
*H03K 3/00*   (2006.01)
(52) U.S. Cl. ...................... 327/205; 327/206
(58) Field of Classification Search ................ 327/205, 327/206
See application file for complete search history.

(56) References Cited

U.S. PATENT DOCUMENTS 5,003,196 A  *  3/1991  Kawaguchi ............... 327/205
5,097,147 A  *  3/1992  Stuebing et al. ........... 327/74
5,691,659 A  *  11/1997  Riley ......................... 327/143
6,882,199 B2 *  4/2005  Sugimura .................. 327/198

FOREIGN PATENT DOCUMENTS

JP         05-048014         2/1993

* cited by examiner

*Primary Examiner*—Kenneth B. Wells
(74) *Attorney, Agent, or Firm*—Stephen B. Parker; Watchstone P+D, plc

(57) ABSTRACT

In some examples, a hysteresis comparator includes a series resistor portion including a plurality of resistors for dividing a power supply voltage, the series resistor portion generating a first midpoint voltage and a second midpoint voltage higher than the first midpoint voltage, a first comparator configured to compare the first midpoint voltage and a reference voltage, a second comparator configured to compare the second midpoint voltage and the reference voltage, and a flip-flop having a clock terminal to which an output signal of the first comparator is applied and a reset terminal to which an output signal of the second comparator is applied. In some examples, a hysteresis comparator further includes an OR gate to which output signals of the first comparator and the second comparator are applied, and an AND gate to which output signals of the first comparator and the second comparator are applied.

12 Claims, 2 Drawing Sheets

HYSTERESIS COMPARATOR AND RESET SIGNAL GENERATOR

This application claims priority under 35 U.S.C.§119 to Japanese Patent Application No. P2004-314627 filed on Oct. 28, 2004, the entire disclosure of which is incorporated herein by reference in its entirety.

BACKGROUND OF THE INVENTION

1. Field of the Invention

The present invention relates to, inter alia, a reset signal generator for microcomputers and a hysteresis comparator for use in such a reset signal generator.

2. Description of the Related Art

The following description sets forth the inventor's knowledge of related art and problems therein and should not be construed as an admission of knowledge in the prior art.

In an electronics device equipped with a controller using a microcomputer, in order to prevent an abnormal power-on operation of the device, it is always necessary to activate the microcomputer at a constant state by supplying a reset signal for resetting the operation to the microcomputer. Conventionally, a comparator is used as a reset signal generating circuit in which a power supply voltage which rises from when the power supply is turned on and a predetermined reference voltage are compared, an "H" level signal is generated when the power supply voltage reaches the reference voltage or above.

In an electronics device, etc., using a battery as a power source, however, the power-on voltage may sometimes rise insufficiently and fluctuate. In such a case, if the power voltage to be applied to the comparator fluctuates around the reference voltage, an "H" level signal and an "L" level signal will be generated alternately, resulting in repetition of reset signals. Thus, the reset of the microcomputer would not be established. Conventionally, in order to prevent the aforementioned false reset operation, a comparator circuit having hysteresis characteristics with respect to the power supply voltage was used in a reset signal generation circuit.

FIG. 3 shows a circuit diagram showing a structure of a conventional comparator circuit having hysteresis characteristics. In FIG. 3, the reference numeral "1" denotes a series resistor portion consisting of a plurality of resistors 1a to 1f connected in series between the power supply voltage Vdd and the ground potential, the reference numeral "2" denotes a reference voltage supply for generating a reference voltage Vref, the reference numeral "3" denotes a comparator for comparing the voltage of the connecting midpoint of the resistors 1c and 1d and the reference voltage Vref, the reference numeral "4" denotes an inverter for inverting the output of the comparator 3, the reference numeral "5" is an inverter for inverting the output of the inverter 4, the reference numeral "6" denotes a switch MOS transistor which is turned on/off by the inverted output of the comparator 3, and the reference numeral "7" denotes an output terminal for outputting the output of the inverter 5 to the subsequent stage. In this example, it is assumed that the resistors 1a to 1f constituting the series resistor portion are equal in resistance with each other.

In the initial condition, if the power supply voltage Vdd is 0 V, the comparator 3 outputs an "L" level signal, which in turn makes the switch MOS transistor 6 turn off. In this state, since the switch MOS transistor 6 is turned off, the midpoint voltage of Vdd/2 is generated at the aforementioned connecting midpoint.

After the power source is turned on, the power supply voltage starts to rise. In accordance with the rising of the power supply voltage, the midpoint voltage at the connecting midpoint of the resistor 1c and the resistor 1d also rises. When the midpoint voltage becomes higher than the reference voltage Vref, the output of the comparator becomes an "H" level. The output of the comparator 3 is inverted by the inventors 4 and 5, and thus an "H" level reset signal will be outputted from the output terminal 7. On the other hand, the "L" level output of the inverter 4 is applied to the gate of the switch MOS transistor 6 to thereby turn on the switch MOS transistor 6. Since the ON resistance value of the turned-off state switch MOS transistor 6 is very small as compared with the values of the resistors 1a and 1b, it can be assumed that the power supply voltage Vdd is applied to the connecting midpoint of the resistor 1b and the resistor 1c. Thus, the power supply voltage Vdd will be divided by a total of four resistors 1c to 1f, and the voltage of the connecting midpoint of the resistors 1c and 1d becomes 3 Vdd/4.

As will be understood from the above, as the output of the comparator 3 changes from the "L" level to the "H" level, the midpoint voltage of the resistors 1c and 1d changes from Vdd/2 to 3 Vdd/4, or rises from Vdd/2 to 3 Vdd/4. In other words, the reference voltage Vref drops seemingly. As a result, even if the power voltage fluctuates after the generation of the reset signal, generation of false reset signals can be prevented (see, e.g., Japanese Unexamined Laid Open Patent Publication No. H05-48014).

In the meantime, in a conventional circuit as mentioned above, low power consumption of the reset signal generating circuit can be attained by increasing the resistance of the resistors 1a to 1f which exerts a large influence on the reset signal generating circuit. A conventional circuit generally employs a resistor such as a silicon resistor having resistance of about KΩ. In order to attain the low power consumption, however, it is required to employ a resistor having a resistance of about MΩ. On the other hand, the reset signal generating circuit is integrated together with a microcomputer. Generally speaking, such integration causes a larger resistance area of a resistor having large resistance. Accordingly, in a conventional circuit, it is necessary to increase the area of the poly silicon resistor to attain the low power consumption, which in turn causes an increased area of the IC chip.

In order to solve the aforementioned problems, it can be considered to employ a device such as a MOS transistor or a diffused resistor having a larger resistance per unit area as the resistors 1a to 1f. In such a case, however, the impedance of the MOS transistor or the diffused resistor as a resistor and that of the switch MOS transistor do not always coincide with each other to satisfy the specification of the reset signal generating circuit, and therefore the change in resistor voltage dividing due to the switching between the ON state and the OFF state of the switch MOS transistor 6 becomes small. Accordingly, after the generation of the reset signal, the midpoint voltage of the resistors 1c and 1d does not become high sufficiently. In other words, the reference voltage does not seemingly become low sufficiently. This may cause false reset signals due to the fluctuation of the power supply voltage.

The description herein of advantages and disadvantages of various features, embodiments, methods, and apparatus disclosed in other publications is in no way intended to limit the present invention. For example, certain features of the preferred embodiments of the invention may be capable of overcoming certain disadvantages and/or providing certain advantages, such as, e.g., disadvantages and/or advantages discussed herein, while retaining some or all of the features, embodiments, methods, and apparatus disclosed therein.

SUMMARY OF THE INVENTION

The preferred embodiments of the present invention have been developed in view of the above-mentioned and/or other problems in the related art. The preferred embodiments of the present invention can significantly improve upon existing methods and/or apparatuses.

Among other potential advantages, some embodiments can provide a hysterisis comparator capable of decreasing a chip area when integrated while preventing generation of false reset signals and attaining decreased power consumption.

Among other potential advantages, some embodiments can provide a reset signal generator or reset signal generating circuit equipped with the aforementioned hysterisis comparator.

According to some embodiments of the present invention, a hysteresis comparator, comprising:
- a series resistor portion including a plurality of resistors for dividing a power supply voltage, the series resistor portion generating a first midpoint voltage and a second midpoint voltage higher than the first midpoint voltage;
- a first comparator configured to compare the first midpoint voltage and a reference voltage;
- a second comparator configured to compare the second midpoint voltage and the reference voltage; and
- a flip-flop having a clock terminal to which an output signal of the first comparator is applied and a reset terminal to which an output signal of the second comparator is applied.

In some examples, in the comparator, the series resistor portion comprises a plurality of MOS transistors.

In some examples, in the comparator, the flip-flop is a D flip-flop having a clock terminal and a reset terminal, and wherein an output signal of the first comparator is applied to the clock terminal and an output signal of the second comparator is applied to the reset terminal.

According to other embodiments of the present invention, a reset signal generator in which an output signal of the aforementioned flip-flop is used as a reset signal.

In some embodiment, in the reset signal generator, the series resistor portion comprises a plurality of MOS transistors.

In some embodiment, in the reset signal generator, the flip-flop is a D flip-flop having a clock terminal and a reset terminal, and wherein an output signal of the first comparator is applied to the clock terminal and an output signal of the second comparator is applied to the reset terminal.

According to other embodiments of the present invention, a hysteresis comparator, comprising:
- a series resistor portion including a plurality of resistors for dividing a power supply voltage, the series resistor portion generating a first midpoint voltage and a second midpoint voltage higher than the first midpoint voltage;
- a first comparator configured to compare the first midpoint voltage and a reference voltage;
- a second comparator configured to compare the second midpoint voltage and the reference voltage;
- an OR gate to which output signals of the first comparator and the second comparator are applied;
- an AND gate to which output signals of the first comparator and the second comparator are applied; and
- a flip-flop having a reset terminal to which an output signal of the OR gate is applied and a clock terminal to which an output signal of the AND gate is applied.

In some examples, in the comparator, the series resistor portion comprises a plurality of MOS transistors.

In some example, in the comparator, the flip-flop is a D flip-flop having a clock terminal and a reset terminal, and an output signal of the AND gate is applied to the clock terminal and an output signal of the OR gate is applied to the reset terminal.

According to other embodiments of the present invention, a reset signal generator in which an output signal of the aforementioned flip-flop is used as a reset signal.

In some example, in the reset signal generator, the series resistor portion comprises a plurality of MOS transistors.

In some example, in the reset signal generator, wherein the flip-flop is a D flip-flop having a clock terminal and a reset terminal, and an output signal of the AND gate is applied to the clock terminal and an output signal of the OR gate is applied to the reset terminal.

With one aspect of this invention, a decreased chip area and low power consumption can be attained simultaneously in the case of integrating the reset signal generating circuit while preventing generation of false reset signals. As a result, it becomes possible to provide a reset signal generating circuit small in chip area and low in power consumption, which can be used in electronics devices using batteries as the power supply source.

Furthermore, with another aspect of this invention, it can be prevented from occurring a false operation which may occur when the two midpoint voltages of the series resistors is reversed at the time of applying a power source. Accordingly, it becomes possible to provide a reset circuit more stable with respect to fluctuations of the power source voltage.

The above and/or other aspects, features and/or advantages of various embodiments will be further appreciated in view of the following description in conjunction with the accompanying figures. Various embodiments can include and/or exclude different aspects, features and/or advantages where applicable. In addition, various embodiments can combine one or more aspect or feature of other embodiments where applicable. The descriptions of aspects, features and/or advantages of particular embodiments should not be construed as limiting other embodiments or the claims.

BRIEF DESCRIPTION OF THE DRAWINGS

The preferred embodiments of the present invention are shown by way of example, and not limitation, in the accompanying figures, in which.

DETAILED DESCRIPTION OF THE PREFERRED EMBODIMENTS

In the following paragraphs, some preferred embodiments of the invention will be described by way of example and not limitation. It should be understood based on this disclosure that various other modifications can be made by those in the art based on these illustrated embodiments.

A preferable embodiment of the present invention will be explained with reference to the attached drawings. The following explanation will be directed to a reset signal generating circuit for use in electronics devices equipped with a controller using a microcomputer. However, it should be understood that the present invention is not limited to the above and can also be applied to various applications required to assuredly generate a reset signal while decreasing the chip area and power consumption.

Figure 1:
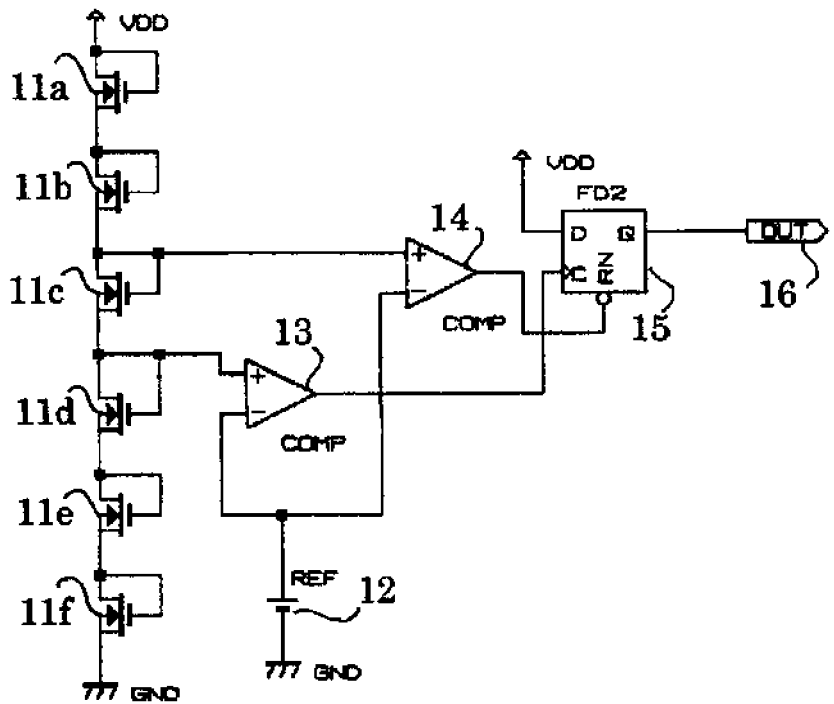
FIG. 1 shows a reset signal generating circuit according to an embodiment of the present invention.

FIG. 1 is a circuit block diagram showing a reset signal generator or a reset signal generating circuit according to an embodiment of the present invention.

In FIG. 1, the reference numeral "11" denotes a series resistor portion consisting of a plurality of MOS transistors 11a to 11f connected in series between the power supply voltage Vdd and the ground potential, the reference numeral "12" denotes a reference voltage supply for generating a reference voltage Vref, the reference numeral "13" denotes a comparator for comparing the voltage of the connecting midpoint of the transistors 11c and 11d and the reference voltage Vref, the reference numeral "14" denotes a comparator for comparing the voltage of the connecting midpoint of the transistors 11b and 11c and the reference voltage Vref, the reference numeral "15" denotes a D flip-flop having a clock terminal to which the output terminal of the comparator 13 is connected and a reset terminal to which the output terminal of the comparator 14 is connected, and the reference numeral "16" denotes an output terminal for outputting the output of the D flip-flop 15 to the subsequent stage. In this example, it is assumed that the series resistor portion consists of a total of six MOS transistors 11a to 11f having the same resistance. However, the number of MOS transistors and/or the resistance of each MOS transistor can be set arbitrary depending on circumstances. Furthermore, it is also possible to employ a device such as a defused resistor having a larger resistance per unit area.

In the initial state, when the power supply voltage VDD is 0 V, the comparators 13 and 14 output an "L" level signal, respectively, which will be applied to the clock terminal and the reset terminal of the D flip-flop 15, respectively. Thus, the D flop-flop 15 outputs an "L" level signal from the Q terminal.

When the power is turn on, at the connecting midpoint of the MOS transistors 11b and 11c and that of the MOS transistors 11c and 11d, a midpoint voltage of 2 Vdd/3 and a midpoint voltage of ½ Vdd will be generated, respectively. As the power supply voltage rises, initially, in the comparator 14, the midpoint voltage of the MOS transistors 11b and 11c becomes higher than the reference voltage Vref, causing the comparator 14 to output an "H" level signal. The "H" level signal will be applied to the reset terminal of the D flip-flop 15. However, the reset terminal of the D flop-flop 15 is a terminal to reset by the down edge output of the comparator 14, and therefore the signal to be outputted from the Q terminal of the D flip-flop 15 is an "L" level. The signal outputted from the Q terminal of the D flip-flop 15 will be outputted from the output terminal 16 as an "L" level signal.

As the power supply voltage further rises and therefore the midpoint voltage of the MOS transistors 11c and 11d becomes higher than the reference voltage Vref, an "H" level signal is generated from the comparator 13 and applied to the clock terminal of the D flip-flop 15. Depending on the output signal of the comparator 13, an "H" level signal will be outputted from the Q terminal of the D flip-flop 15. As a result, a reset signal is generated from the output terminal 16.

The next explanation will be directed to the case in which the power supply voltage drops from a certain voltage. As the power supply voltage Vdd drops, the midpoint voltage of the MOS transistors 11c and 11d becomes lower than the reference voltage Vref. Therefore, the output signal from the comparator 13 changes from the "H" level to the "L" level. Since the clock terminal of the D flip-flop 15 does not response to the down edge of the output signal of the comparator 13, the D flip-flop 15 keeps the "H" level output signal As the power supply voltage Vdd further drops, the midpoint voltage of the MOS transistors 11b and 11c becomes lower than the reference voltage Vref. As a result, the output signal of the comparator 14 changes from the "H" level to the "L" level, causing a reset of the D flip-flop 15. Thus, the D flip-flop 15 outputs an "L" level signal. Therefore, in cases where the power voltage drops, the signal of the Q terminal of the flip-flop changes to the "L" level when the midpoint voltage of the MOS transistors 11b and 11c becomes lower than the reference voltage Vref.

As will be understood from the above, in cases where the power voltage Vdd rises after the power is turned on, a reset signal will be generated when the midpoint voltage of the MOS transistors 11c and 11d becomes higher than the reference voltage Vref. On the other hand, in cases where the power voltage Vdd drops, the reset signal is terminated when the midpoint voltage of the MOS transistors 11b and 11c becomes lower than the reference voltage Vref. In the case of FIG. 1, the threshold value for terminating the reset signal is lower than the threshold value for generating the reset signal. As a result, even if the power supply voltage Vdd fluctuates after the generation of the reset signal, generation of false reset signals can be prevented. Furthermore, in the case of employing MOS transistors or diffused resistors in the series resistor portion to attain low power consumption, it is possible to assuredly set the threshold value which determines the generation/termination of the reset signal since a conventional structure for changing the connection of the series resistors is not employed.

Figure 2:
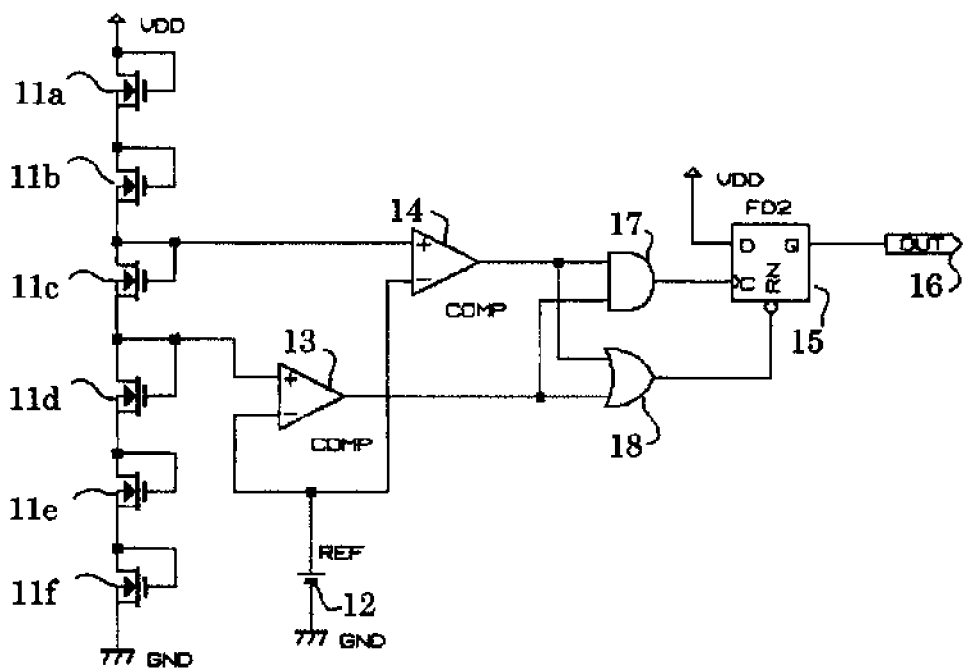
FIG. 2 shows a reset signal generating circuit according to another embodiment of the present invention.
Figure 3:
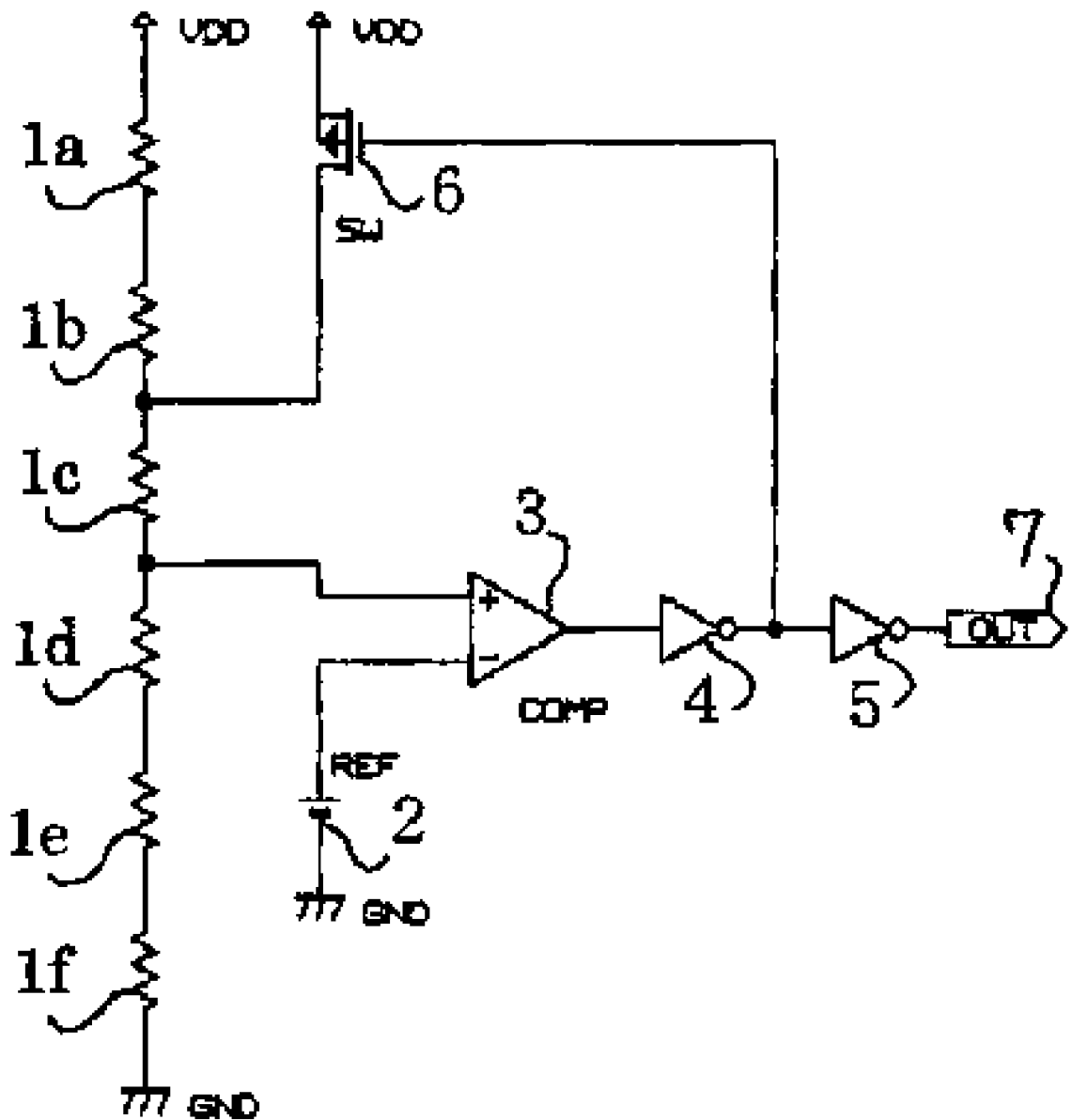
FIG. 3 shows a conventional reset signal generating circuit.

FIG. 2 is a circuit block diagram showing a reset signal generating circuit according to a second embodiment of the present invention. In this circuit, an AND gate 17 and an OR gate 18 are added to the circuit shown in FIG. 1. The AND gate inputs the output signals of the comparators 13 and 14 and applies an output signal to the clock terminal of the D flip-flop 15. The OR gate 18 inputs the output signals of the comparators 13 and 14 and applies an output signal to the reset terminal of the D flip-flop 15.

When the power supply voltage Vdd rises after the power is turned on, the output signal of the comparator 14 becomes an "H" level first, and the "H" level signal is applied to the AND gate 17. In the AND gate 17, since the output signal of the comparator 13 remains an "L" level, the output signal of the AND gate 17 remains an "L" level. On the other hand, the output signal of the comparator 14 is applied to the reset terminal of the D flip-flop 15 via the OR gate 18. However, the D flip-flop 15 does not respond to the output signal of the OR gate 18, and the output signal remains the "L" level. When the power supply voltage Vdd further rises and the output of the comparator 13 becomes an "H" level, the output signal of the AND gate 17 becomes an "H" level. Thus, the output of the D flip-flop 15 becomes an "H" level. As a result, a reset signal is outputted from the output terminal 16. Furthermore, the output signal of the comparator 13 is also applied to the OR gate 18. Since the output signal of the OR gate 18 has already become the "H" level, the output of the OR gate 18 does not change even if the output signal of the comparator 13 becomes an "H" level.

In this embodiment, during the rising of the power supply voltage Vdd after the power is turned on, the comparator 13 may sometimes generate an "H" level signal at a timing earlier than the comparator 14. In such a case, when an output signal of the comparator 13 is generated first, the output signal of the comparator 13 is applied to the reset terminal of the D flip-flop 15 via the OR gate 18. However, the D flip-flop 15 does not respond to the output signal of the OR gate 18, and does not become a reset state. Furthermore, although the output signal of the comparator 13 is applied to the AND gate 17, the output signal of the AND gate 17 is an "L" level since the output level of the comparator 14 is an "L" level. Subsequently, when the output signal of the comparator 14 becomes an "H" level, the output of the AND gate 17 becomes an "H" level and the output of the D flip-flop 15 becomes an "H" level. Thus, the output of the D flip-flop 15 becomes an "H" level to generate a reset signal. Accordingly, even in cases where the output timings of the comparators 13 and 14 are reversed as compared to a normal state, a reset signal will be generated in response to the output changes of the comparator 14.

The following explanation will be directed to the case in which the power supply voltage Vdd drops from a certain level at which a predetermined voltage is kept. In a normal condition, the output of the comparator 13 becomes an "L" level first. Depending on the output changes of the comparator 13, the output of the AND gate 17 changes to an "L" level and the output of the OR gate 18 remains the "H" level. Accordingly, the output level of the D flip-flop 15 does not change. Subsequently, when the output of the comparator 14 changes to an "L" level, the output of the OR gate 18 changes to an "L" level. Thus, the D flip-flop 15 is reset. Accordingly, the reset signal which has been outputted from the output terminal 16 is terminated.

In an abnormal state, the output of the comparator 14 changes to an "L" level first. In response to the change, the output of the AND gate 17 becomes an "L" level, but the output of the OR gate 18 remains the "H" level. Therefore, the status of the D flip-flop does not change. Furthermore, when the output of the comparator 13 changes to an "L" level, only the output of the OR gate 18 becomes an "L" level, and the D flip-flop 15 is reset. Accordingly, the output of the D flip-flop 15 becomes an "L" level, and the generation of the reset signal is terminated. In this case too, even in cases where the output timings of the comparators 13 and 14 are reversed as compared to a normal state, a reset signal will be terminated assuredly in response to the output changes of the comparator 14. Thus, even in an abnormal state, the threshold vale for terminating the reset signal can be lower than the threshold value for generating the reset signal. Accordingly, it becomes possible to prevent the generate of false reset signals due to the changes of the power supply voltage.

As explained above, in the first and second embodiments of the present invention, a decreased chip area and low power consumption can be attained simultaneously in the case of integrating the reset signal generating circuit while preventing generation of false reset signals. As a result, it becomes possible to provide a reset signal generating circuit small in chip area and low in power consumption, which can be used in electronics devices using batteries as the power supply source. Furthermore, with the second embodiment, it can be prevented assuredly from occurring a false operation. Accordingly, it becomes possible to provide a reset circuit more stable with respect to fluctuations of the power source voltage.

While the present invention may be embodied in many different forms, a number of illustrative embodiments are described herein with the understanding that the present disclosure is to be considered as providing examples of the principles of the invention and such examples are not intended to limit the invention to preferred embodiments described herein and/or illustrated herein.

While illustrative embodiments of the invention have been described herein, the present invention is not limited to the various preferred embodiments described herein, but includes any and all embodiments having equivalent elements, modifications, omissions, combinations (e.g., of aspects across various embodiments), adaptations and/or alterations as would be appreciated by those in the art based on the present disclosure. The limitations in the claims are to be interpreted broadly based on the language employed in the claims and not limited to examples described in the present specification or during the prosecution of the application, which examples are to be construed as non-exclusive. For example, in the present disclosure, the term "preferably" is non-exclusive and means "preferably, but not limited to." In this disclosure and during the prosecution of this application, means-plus-function or step-plus-function limitations will only be employed where for a specific claim limitation all of the following conditions are present in that limitation: a) "means for" or "step for" is expressly recited; b) a corresponding function is expressly recited; and c) structure, material or acts that support that structure are not recited. In this disclosure and during the prosecution of this application, the terminology "present invention" or "invention" is meant as a non-specific, general reference and may be used as a reference to one or more aspect within the present disclosure. The language present invention or invention should not be improperly interpreted as an identification of criticality, should not be improperly interpreted as applying across all aspects or embodiments (i.e., it should be understood that the present invention has a number of aspects and embodiments), and should not be improperly interpreted as limiting the scope of the application or claims. In this disclosure and during the prosecution of this application, the terminology "embodiment" can be used to describe any aspect, feature, process or step, any combination thereof, and/or any portion thereof, etc. In some examples, various embodiments may include overlapping features. In this disclosure and during the prosecution of this case, the following abbreviated terminology may be employed: "e.g." which means "for example;" and "NB" which means "note well."

What is claimed is:

1. A hysteresis comparator, comprising:
    a series resistor portion including a plurality of resistors for dividing a power supply voltage, the series resistor portion generating a first midpoint voltage and a second midpoint voltage higher than the first midpoint voltage;
    a first comparator configured to compare the first midpoint voltage and a reference voltage;
    a second comparator configured to compare the second midpoint voltage and the reference voltage; and
    a flip-flop having a clock terminal to which an output signal of the first comparator is applied and a reset terminal to which an output signal of the second comparator is applied.

2. The comparator as recited in claim 1, wherein the plurality of resistors of the series resistor portion comprise a plurality of MOS transistors.

3. The comparator as recited in claim 2, wherein the flip-flop is a D flip-flop.

4. A reset signal generator comprising a hysteresis comparator as recited in claim 1, wherein an output signal of the flip-flop is used as a reset signal.

5. The reset signal generator as recited in claim 4, wherein the plurality of resistors of the series resistor portion comprise a plurality of MOS transistors.

6. The reset signal generator as recited in claim 5, wherein the flip-flop is a D flip-flop.

7. A hysteresis comparator, comprising:
a series resistor portion including a plurality of resistors for dividing a power supply voltage, the series resistor portion generating a first midpoint voltage and a second midpoint voltage higher than the first midpoint voltage;
a first comparator configured to compare the first midpoint voltage and a reference voltage;
a second comparator configured to compare the second midpoint voltage and the reference voltage;
an OR gate to which output signals of the first comparator and the second comparator are applied;
an AND gate to which output signals of the first comparator and the second comparator are applied; and
a flip-flop having a reset terminal to which an output signal of the OR gate is applied and a clock terminal to which an output signal of the AND gate is applied.

8. The comparator as recited in claim 7, wherein the plurality of resistors of the series resistor portion comprise a plurality of MOS transistors.

9. The comparator as recited in claim 8, wherein the flip-flop is a D flip-flop.

10. A reset signal generator comprising a hysteresis comparator as recited in claim 7, wherein an output signal of the flip-flop is used as a reset signal.

11. The reset signal generator as recited in claim 10, wherein the plurality of or resistors of the series resistor portion comprise a plurality of MOS transistors.

12. The reset signal generator as recited in claim 11, wherein the flip-flop is a D flip-flop.

* * * * *